United States Patent
Dissegna

(10) Patent No.: US 10,861,843 B2
(45) Date of Patent: Dec. 8, 2020

(54) ELECTROSTATIC DISCHARGE PROTECTION DEVICE

(71) Applicant: Texas Instruments Incorporated, Dallas, TX (US)

(72) Inventor: Mariano Dissegna, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 809 days.

(21) Appl. No.: 15/387,193

(22) Filed: Dec. 21, 2016

(65) Prior Publication Data

US 2018/0175020 A1 Jun. 21, 2018

(51) Int. Cl.
| | |
|---|---|
| H01L 27/02 | (2006.01) |
| H01L 49/02 | (2006.01) |
| H01L 29/861 | (2006.01) |
| H01L 29/06 | (2006.01) |

(52) U.S. Cl.
CPC ...... *H01L 27/0255* (2013.01); *H01L 27/0288* (2013.01); *H01L 28/20* (2013.01); *H01L 29/0688* (2013.01); *H01L 29/861* (2013.01)

(58) Field of Classification Search
CPC ............. H01L 27/0255; H01L 27/0259; H01L 27/0288; H01L 29/0688; H01L 29/861
See application file for complete search history.

(56) References Cited

U.S. PATENT DOCUMENTS

| | | | |
|---|---|---|---|
| 4,514,747 A | 4/1985 | Miyata et al. | |
| 4,569,120 A * | 2/1986 | Stacy | H01L 21/326 |
| | | | 148/DIG. 55 |
| 9,368,487 B1 | 6/2016 | Su et al. | |
| 10,270,244 B2 * | 4/2019 | Chao | H02H 9/046 |

(Continued)

FOREIGN PATENT DOCUMENTS

| | | |
|---|---|---|
| EP | 0345432 | 12/1989 |
| JP | 20080134503 | 2/2008 |

OTHER PUBLICATIONS

PCT (Patent Cooperation Treaty) International Search Report, dated Apr. 5, 2018, PCT/US 2017/067957.

(Continued)

*Primary Examiner* — Jared Fureman
*Assistant Examiner* — Christopher J Clark
(74) *Attorney, Agent, or Firm* — Jacqueline J. Garner; Charles A. Brill; Frank D. Cimino

(57) ABSTRACT

Semiconductor devices including a diode and a resistor are disclosed herein. An example of a semiconductor device includes a substrate having a surface. A first doped semiconductive region is disposed in the substrate below the surface. A second doped semiconductive region is disposed in the substrate and extends between the surface and the first doped semiconductive region. The second doped semiconductive region is at least partially in contact with the first doped semiconductive region. The first doped semiconductive region and the second doped semiconductive region together define an isolation tank. A third doped semiconductive region is disposed in the isolation tank and is in contact with the surface. The second doped semiconductive region and the third doped semiconductive region form a diode. At least one opening in the isolation tank forms a resistive path for current to flow between the substrate and the third doped semiconductive region.

19 Claims, 4 Drawing Sheets

(56) References Cited

U.S. PATENT DOCUMENTS

| | | | |
|---|---|---|---|
| 2002/0008563 A1* | 1/2002 | Lin | H01L 27/0255 |
| | | | 327/310 |
| 2007/0120193 A1 | 5/2007 | Inoue | |
| 2007/0278568 A1 | 12/2007 | Williams et al. | |
| 2007/0284667 A1* | 12/2007 | Nagai | H01L 27/0259 |
| | | | 257/361 |
| 2008/0112210 A1* | 5/2008 | Shirahama | G11C 7/12 |
| | | | 365/148 |
| 2009/0021873 A1* | 1/2009 | Spode | H01L 27/0255 |
| | | | 361/56 |
| 2011/0016440 A1* | 1/2011 | Bergmann | G06F 17/5036 |
| | | | 716/106 |
| 2012/0099230 A1 | 4/2012 | Moon | |
| 2013/0099280 A1* | 4/2013 | Coyne | H01L 29/735 |
| | | | 257/170 |
| 2013/0270606 A1* | 10/2013 | Chen | H01L 29/7835 |
| | | | 257/183 |
| 2014/0070315 A1* | 3/2014 | Levy | H01L 29/0634 |
| | | | 257/343 |
| 2014/0247527 A1 | 9/2014 | Otake et al. | |
| 2016/0148925 A1* | 5/2016 | Tonazzo | H01L 27/0259 |
| | | | 257/361 |
| 2017/0098643 A1* | 4/2017 | Xiu | H01L 27/0259 |
| 2017/0213815 A1* | 7/2017 | Bobde | H01L 27/0248 |
| 2017/0294432 A1* | 10/2017 | Park | H01L 22/14 |
| 2018/0061822 A1* | 3/2018 | Kanda | H01L 27/0255 |

OTHER PUBLICATIONS

European Patent Office Search Report, dated Nov. 19, 2019, PCT/US 2017067957.

* cited by examiner

ELECTROSTATIC DISCHARGE PROTECTION DEVICE

BACKGROUND

Generally, for reliable circuit design, various transient protection circuits are implemented to protect electronic devices from high voltage surges. For example, certain protection circuits protect electronic devices from electrostatic discharge (ESD). ESD can cause serious damage to electronic devices and most reliable designs include some form of ESD protection. Typically, ESD protection circuits are implemented in parallel with various electronic device circuits and provide least resistive paths to a ground or other nodes for transient currents, thus bypassing and protecting electronic devices. The size of ESD protection circuits increases with voltage levels of the components in which they are implemented and can use up significant semiconductor area in electronic devices.

SUMMARY

Semiconductor devices including a diode and a resistor are disclosed herein. An example of a semiconductor device includes a substrate having a surface. A first doped semiconductive region is disposed in the substrate below the surface. A second doped semiconductive region is disposed in the substrate and extends between the surface and the first doped semiconductive region. The second doped semiconductive region is at least partially in contact with the first doped semiconductive region. The first doped semiconductive region and the second doped semiconductive region together define an isolation tank. A third doped semiconductive region is disposed in the isolation tank and is in contact with the surface. The second doped semiconductive region and the third doped semiconductive region form a diode. At least one opening in the isolation tank forms a resistive path for current to flow between the substrate and the third doped semiconductive region.

DETAILED DESCRIPTION

The following description provides many different embodiments, or examples, for implementing different features of semiconductor devices implemented as electrostatic discharge (ESD) protection devices and/or circuits. These descriptions are merely for illustrative purposes and do not limit the scope of the invention.

ESD protection circuits, devices, and methods are disclosed herein. Some examples described herein are implemented for bidirectional ESD protection, which has been troublesome to implement in the past. Some of the ESD protection circuits disclosed herein may be fabricated into semiconductor devices using various existing technologies without any dedicated mask/process steps. The characteristics of the ESD protection circuits can be tuned according to a particular bidirectional pin specific application by adjusting layout parameters as described herein.

Figure 1:
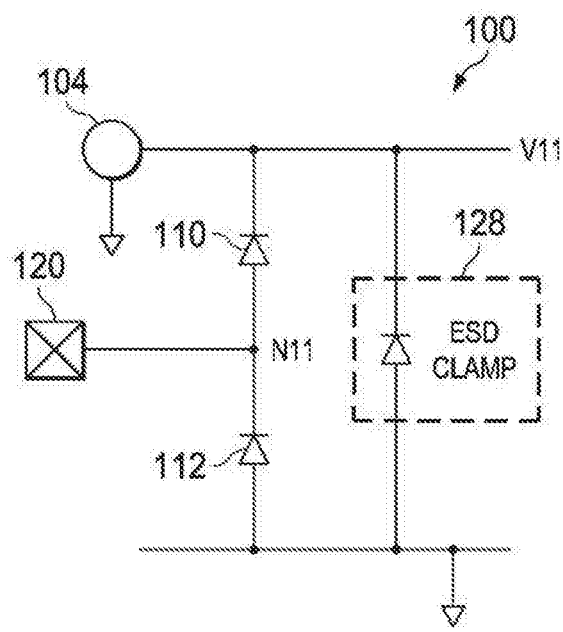
FIG. 1 is a schematic diagram of conventional ESD protection circuitry.

FIG. 1 is a schematic diagram of conventional ESD protection circuitry 100, which may be implemented in another circuit (not shown). For example, the circuitry 100 may be coupled to each pin or contact of an integrated circuit that has a plurality of contacts. The circuitry 100 is coupled to a voltage source or power supply 104 that generates a voltage V11 and to a second voltage potential, which in the example of FIG. 1 is ground. A first diode 110 is coupled between the power supply 104 and a node N11. A second diode 112 is coupled between the node N11 and ground. The node N11 is coupled to a pin or other conductor 120 that is coupled to or a part of the other circuit described above. In some examples, the conductor 120 is a conductor or an input/output (I/O) node in the other circuit. An ESD clamp 128 is coupled between the power supply 104 and ground. In case of an ESD event occurring at the conductor 120, either of the diodes 110 or 112 will conduct a resulting transient current to ground or to the power supply 104. In other situations, the transient current may conduct through the ESD clamp 128. The circuitry 100 conducts the transient current to the power supply 104 or ground, which protects components coupled to the contact 120 from being damaged or temporarily malfunctioning as a result of the transient current.

The circuitry 100 has many limitations. As noted in FIG. 1, the circuitry 100 requires two diodes 110, 112, and an ESD clamp 128. These components require space on the larger circuit, which defeats the purpose of reducing the size of many circuits. When the circuitry 100 is implemented with input/output (I/O) pins or contacts, each pin has a dedicated ESD protection circuitry 100 coupled to the ground bus or ESD diodes coupled to the power supply bus and ground bus, which may be relatively complex. In addition, pins having different voltages require different ESD protection circuitry 100 with components selected for the specific voltage requirements. Other conventional ESD protection circuits are similar to the circuitry 100, but include transistors coupled in series between the power supply 104 and ground. A resistor that couples the node N11 to the junction of the transistors may be needed to protect them during an ESD event. To compensate the loss across the additional resistor, these transistors are large and use excessive space on an integrated circuit or other device.

Bidirectional ESD protection applications are particularly challenging because the voltage on the contact 120 can swing to both positive and negative during normal operation. These types of pins require special ESD protection circuits and full electrical isolation, which is complex and usually leads to additional process masks and thus higher cost.

Figure 2:
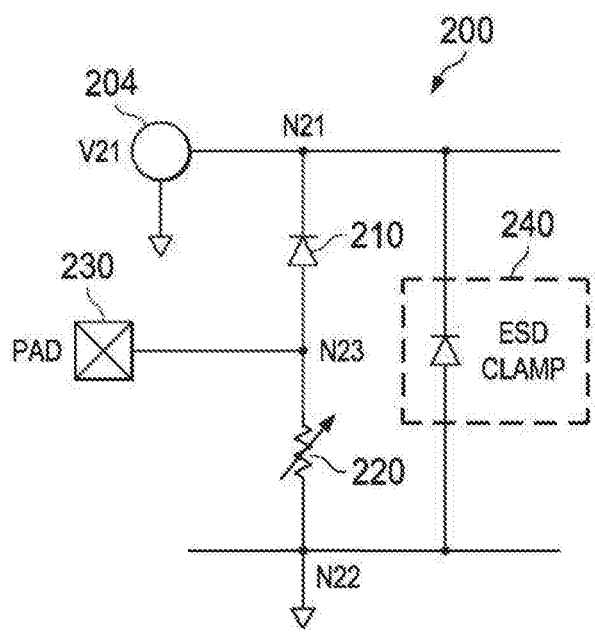
FIG. 2 is a schematic diagram of ESD protection circuitry that overcomes limitations of the circuitry of FIG. 1.

FIG. 2 is a schematic diagram of ESD protection circuitry 200 that overcomes limitations in the circuitry 100 of FIG. 1. The circuitry 200 may be implemented in another circuit (not shown). The circuitry 200 may be coupled to a voltage source or power supply 204 at a node N21, wherein the power supply 204 generates a voltage V21. The circuitry 200 may also be coupled to a second voltage potential at a node N22, which in the example of FIG. 2 is ground. The node N21 is sometimes referred to as a first node and the node N22 is sometimes referred to as second node. A diode 210 is coupled between the power supply 204 (node N21) and a node N23. A resistor 220 is coupled between the node N23 and ground (node N22). The resistor 220 is shown as being a variable resistor, wherein the value of the resistor 220 is dependent on the voltage applied to the diode 210 as described below. For example, the resistance of the resistor 220 may vary depending on the voltage potential at node N21. Node N23 is coupled to a terminal or other conductor 230 that is coupled to another circuit (not shown) that is protected by the circuitry 200. In some examples, the conductor 230 is a conductor or an input/output (I/O) terminal or pad in the other circuit. Both the diode 210 and the resistor 220 may be integrally formed in a substrate as a single semiconductor device or unit as described below. The circuitry 200 further includes an ESD clamp 240 coupled between the nodes N21 and N22. As noted in FIG. 2, the circuitry 200 only requires one diode instead of two diodes.

When an ESD event occurs at the conductor 230, either the diode 210 or the resistor 220 conducts the resulting transient current to ground or the power supply 204 depending on the polarity of the ESD event. More specifically, current resulting from positive ESD events between the conductor 230 and the power supply 204 flows to the power supply 204 through the diode 210. Current resulting from positive or negative ESD events between the contact 230 and ground flows through the resistor 220 to ground. The ESD clamp 128 may still be included in the circuitry 200 for the ESD strike protection with a negative voltage on the contact 230 relative to the voltage V21.

Figure 3A:
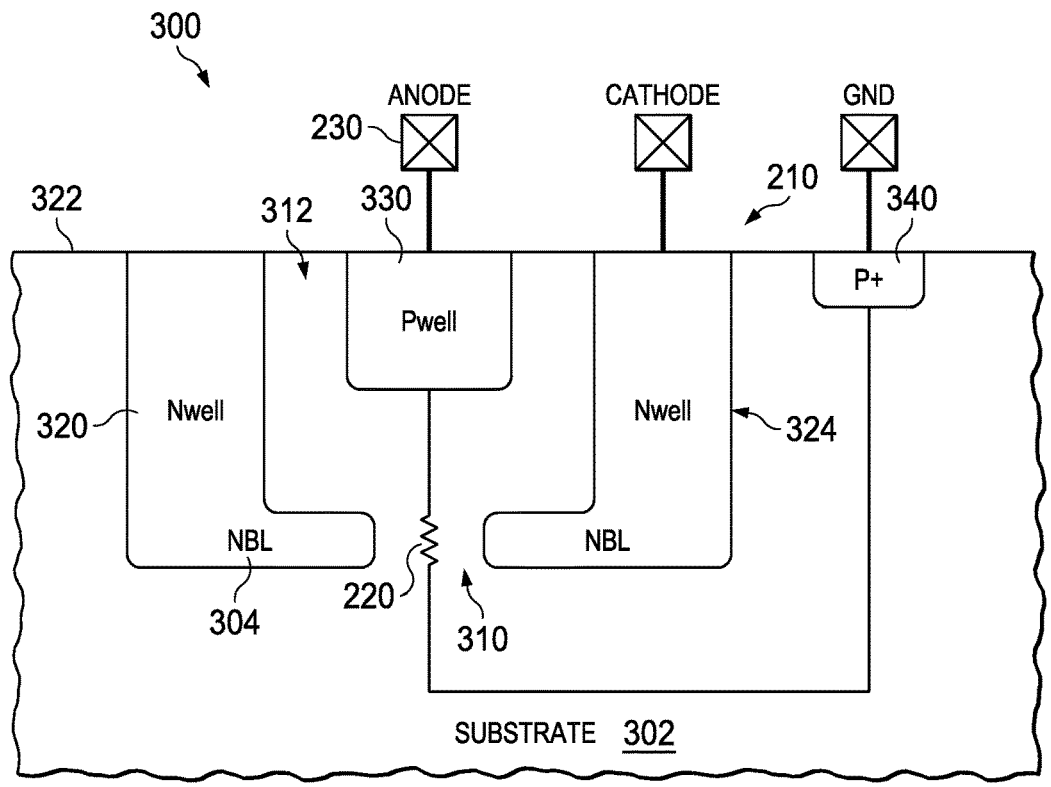
FIG. 3A is a cross sectional view of a semiconductor device that includes the diode and the resistance of FIG. 2 located in a substrate.
Figure 3B:
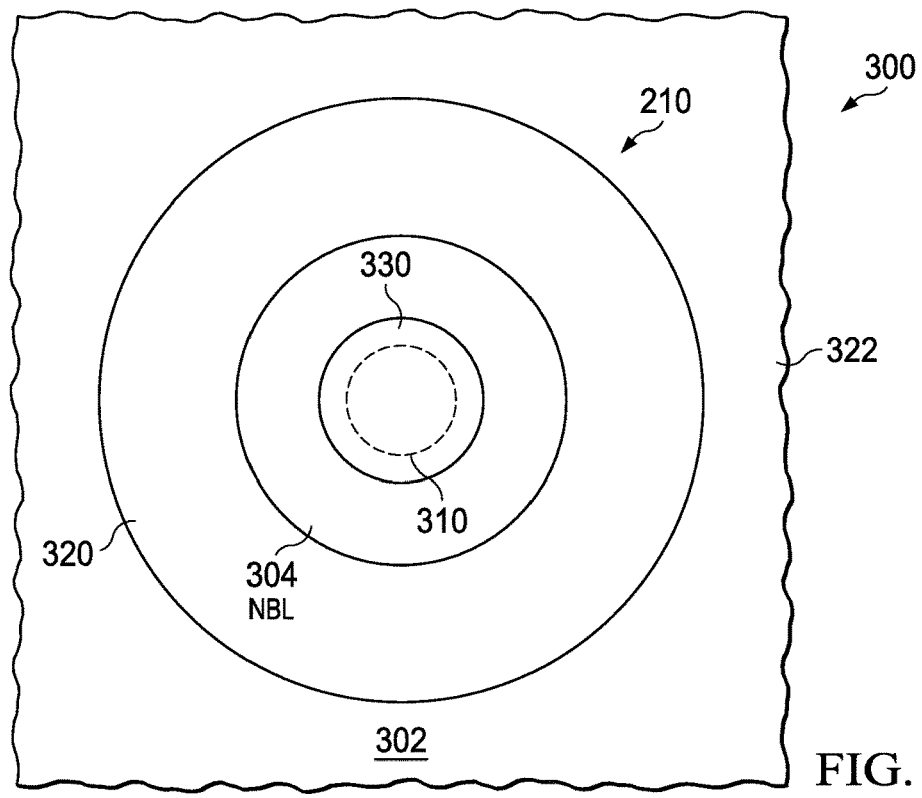
FIG. 3B is a top plan view of the semiconductor device of FIG. 3A.

FIG. 3A is a cross sectional view of a semiconductor device 300 that includes the diode 210 and the resistor 220 of FIG. 2 fabricated into or located within a substrate 302. FIG. 3B is a top plan view of the semiconductor device 300 of FIG. 3A. The semiconductor device 300 is described herein as having certain p-type and n-type layers or regions, which may be switched in some examples. As shown in FIG. 3A, the resistor 220 is integral to the diode 210 as described herein and the two are not necessarily separate components.

The substrate 302 in the example of FIGS. 3A and 3B is a p-type material that is sometimes referred as a p-type material or region, meaning a p-type material has been diffused into the substrate 302. The semiconductor device 300 includes an n-type buried layer (NBL) 304 fabricated into the substrate 302. The layer 304 is sometimes referred to as a doped semiconductive region that is disposed in the substrate 302. The NBL 304 is situated substantially parallel to a substrate surface 322 of the substrate 302. The NBL 304 has an opening 310 that couples the interior 312 of the semiconductor device 300 with the substrate 302. As described in greater detail below, the opening 310 provides a current path during an ESD event. An Nwell 320 extends between the NBL 304 and the surface 322 of the substrate 302. The Nwell 320 and the NBL 304, define an isolation tank 324 wherein the interior 312 is within the isolation tank 324. The Nwell 320 is sometimes referred to herein as a doped semiconductive region in the substrate 302 and extends substantially perpendicular to the surface 322. The Nwell 320 serves as the cathode of the diode 210, FIG. 2. A Pwell 330 is formed within the interior 312 so as to be partially surrounded by the Nwell 320 and within the isolation tank 324. The Pwell 330 serves as the anode of the diode 210 and is sometimes referred to herein as a doped semiconductive region in the substrate 302.

The semiconductor device 300 further includes a P+ layer 340 formed therein, which is sometimes referred to herein as a doped semiconductive region in the substrate 302. The P+ layer 340 is coupled to a node or terminal, such as the ground node (node N22) shown in FIG. 2 and serves as a path for current during an ESD event. More specifically, the anode of the diode 210 is coupled to the P+ layer 340 by way of the resistor 220 created by the opening 310 in the NBL 304. The value of the resistor 220 is a function of the voltage potential at the anode of the diode 210 during an ESD event. The resistor 220 is described as being in the opening 310, In practice, the opening 310 forms a resistive path noted as the resistor 220.

The value of the resistor 220 is dependent on the voltage potential of the cathode of the diode 210. The resistance increases with the voltage potential of the cathode. Eventually, a certain potential is reached, which is determined by the layout of the semiconductor device 300 and the opening 310, and causes the resistance to become very high or infinite. The high resistance isolates the interior 312 from the substrate 302. Accordingly, during normal operation, the voltage potential on the cathode is high, resulting in a very high or infinite resistance. The high resistance prevents the circuitry 200, FIG. 2, from interfering with signals transmitted to other circuitry (not shown) by way of the contact 230. The high resistance also enables the voltage on the contact 230 to swing positive or negative with respect to the substrate 302 since the interior 312 is completely isolated from the substrate 302. During an ESD event between the contact 230 and ground, the resistance of the resistor 220 is small because node N21 is not biased, creating a low resistance path from the anode of the diode 210, which is coupled to the contact 230, to ground. With reference to FIG. 3A, the resistance path is between the Pwell 330 and the P+ layer 340 through the opening 310, which constitutes the resistor 220. This low resistance path prevents transients generated during the ESD event from causing problems with the circuitry or damaging components.

During positive ESD events between the contact 230 and the power supply 204, the diode 210 is forward biased, so the current generated by the transients during the ESD event are conducted to the power supply 204. With reference to FIG. 3A, the transient currents flow from the Pwell 330 to the Nwell 320, which is coupled to the power supply 204. During a negative ESD event, the cathode voltage floats, so the resistance of the resistor 220 is small, creating a low resistance path to ground. Currents generated by the transients during the ESD event pass through the resistor 220, which has low resistance, to ground, so they do not interfere with circuits coupled to the contact 230.

The voltage on the cathode that causes a significant increase in the resistance of the resistor 220 is referred to as the punch-through voltage and is at least partially dependent on the size of the opening 310 in the NBL 304. A smaller opening 310 results in a smaller punch-through voltage. During fabrication of the semiconductor device 300, the size of the opening 310 is set to a specific punch-through voltage depending on the application of the semiconductor device 300.

Figure 4A:
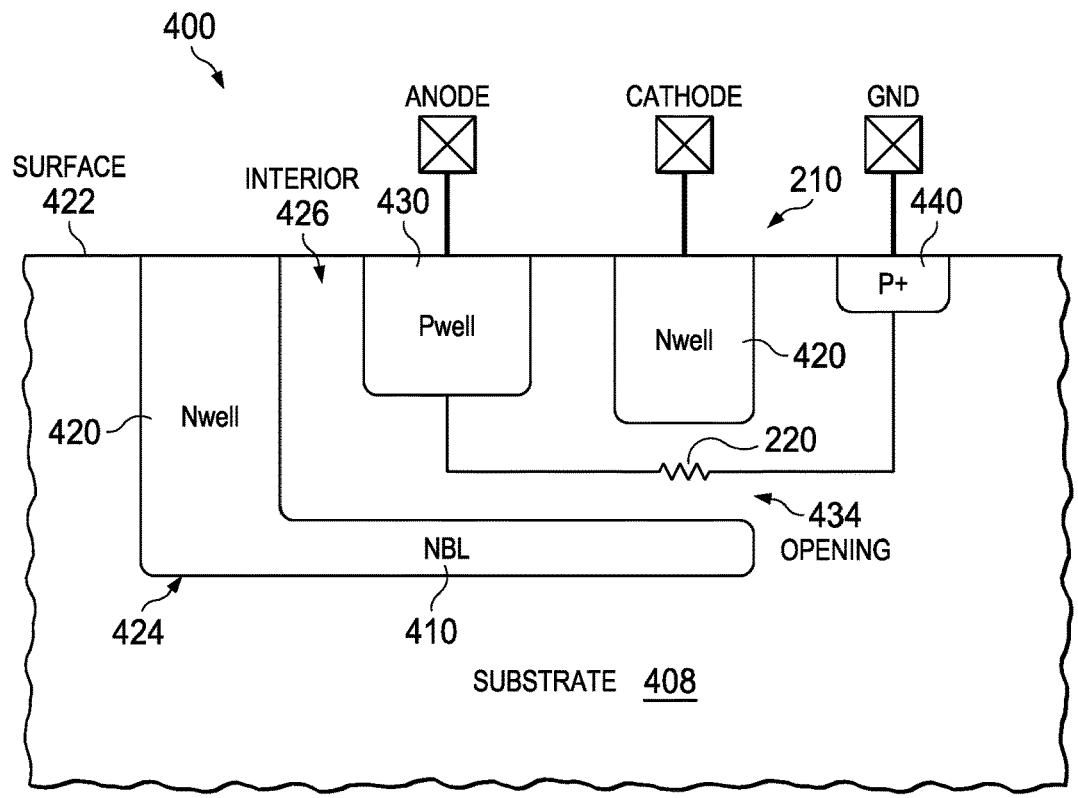
FIG. 4A is a cross-sectional view of an example of a semiconductor device implementing the circuitry of FIG. 2.
Figure 4B:
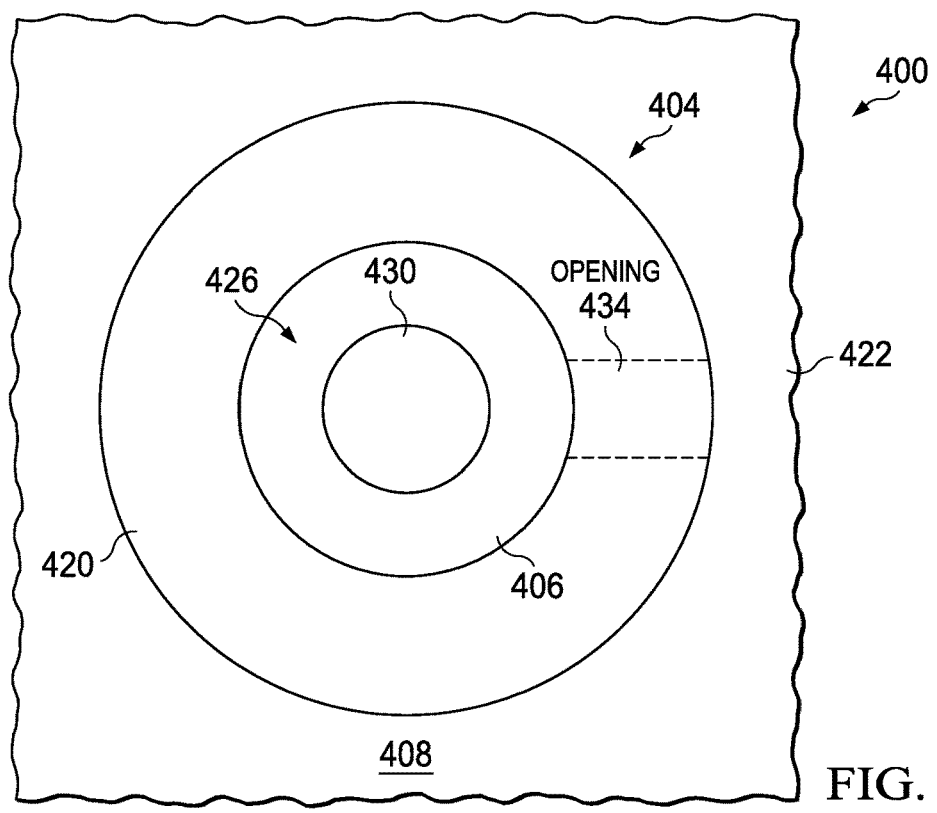
FIG. 4B is a top plan view of the semiconductor device of FIG. 4A.

FIG. 4A is a cross-sectional view of an example of a semiconductor device 400 implementing the circuitry 200 of FIG. 2, which includes the diode 210 and the resistor 220. FIG. 4B is a top plan view of the semiconductor device 400 of FIG. 4A. The semiconductor device 400 includes the diode 210 and the resistor 220 fabricated into a substrate 408. The semiconductor device 400 is similar to the semiconductor device 300 of FIG. 3 with the exception of an opening in the Nwell rather than the NBL. The substrate 408 in the example of FIGS. 4A and 4B is a p-type material and includes an NBL 410 fabricated into or located within the substrate 408 and situated substantially parallel to the surface 422 of the substrate 408. The NBL 410 is sometimes referred to as a doped semiconductive region in the substrate 408. An Nwell 420 extends between the NBL 410 and the surface 422 of the substrate 408 and is substantially perpendicular to the surface 422. The Nwell 420 at least partially contacts the NBL 410. The NBL 410 and the Nwell 420 form an isolation tank 424 having an interior 426. The Nwell 420 serves as the cathode of the diode 210. A Pwell 430 is located within the interior 426 of the isolation tank 424 so as to be at least partially surrounded by the Nwell 420. The Pwell 430 serves as the anode of the diode 210. The Nwell 420 and the Pwell 430 are sometimes referred to as doped semiconductive regions.

The Nwell 420 has an opening 434 formed therein that serves as the resistor 220 described in FIG. 2. As described above, the resistance of the resistor 220 is a function of the cathode voltage, which is the voltage applied to the Nwell 420. The punch-through voltage associated with the opening 434 is proportional to the size of the opening 434 as described above. The substrate 408 includes a P+ layer 440 formed therein, which is sometimes referred to as the fourth layer or fourth doped semiconductor region. The P+ layer 440 is coupled to a terminal or a node, such as the ground node (node N22) shown in FIG. 2 and serves as a path for current during an ESD event. More specifically, the anode of the diode 210 is coupled to the P+ layer 440 by way of the resistor 220 created by the opening 434 in the Nwell 420. The value of resistance is a function of the voltage potential at the anode of the diode 210 during an ESD event and during normal operation.

The opening 434 fabricated in the Nwell 420 creates a shorter current path between the anode and the ground, which is coupled to the P+ layer 440, relative to an opening fabricated in the NBL 410 as described with reference to FIG. 3. The semiconductor device 400 is more effective than the semiconductor device 300 of FIG. 3 at ESD protection, but its fabrication may be more difficult.

Figure 5:
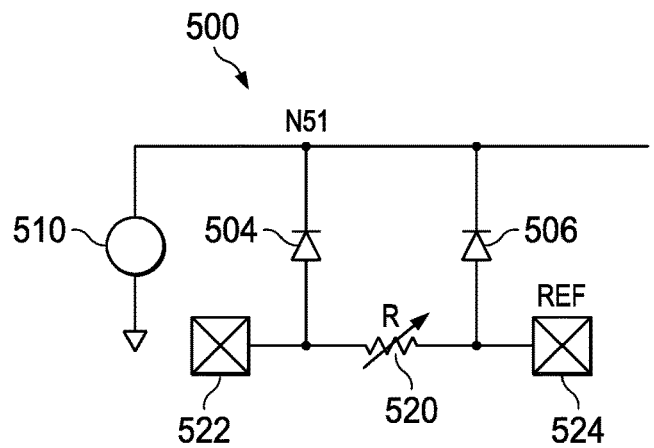
FIG. 5 is a schematic diagram of an ESD circuit that provides isolation of the ESD components.

FIG. 5 is a schematic diagram of an ESD circuit 500 that provides isolation of the ESD components. The circuit 500 includes a first diode 504 and a second diode 506 that have their cathodes coupled to a node N51. In the example of FIG. 5, node N51 is coupled to a power supply 510, which may be a voltage source. The anodes of the diodes 504 and 506 are coupled together by way of a resistor 520, which is substantially similar to the resistor 220 of FIG. 2. The anode of the first diode 504 is coupled to a terminal or contact 522 that may be coupled to another circuit (not shown) that is being protected from ESD events. The anode of the second diode 506 is coupled to a reference node 524 that is coupled to a potential that is different than the voltage of the power supply 510. As shown in FIG. 5, the circuit 500 provides complete isolation.

Figure 6:
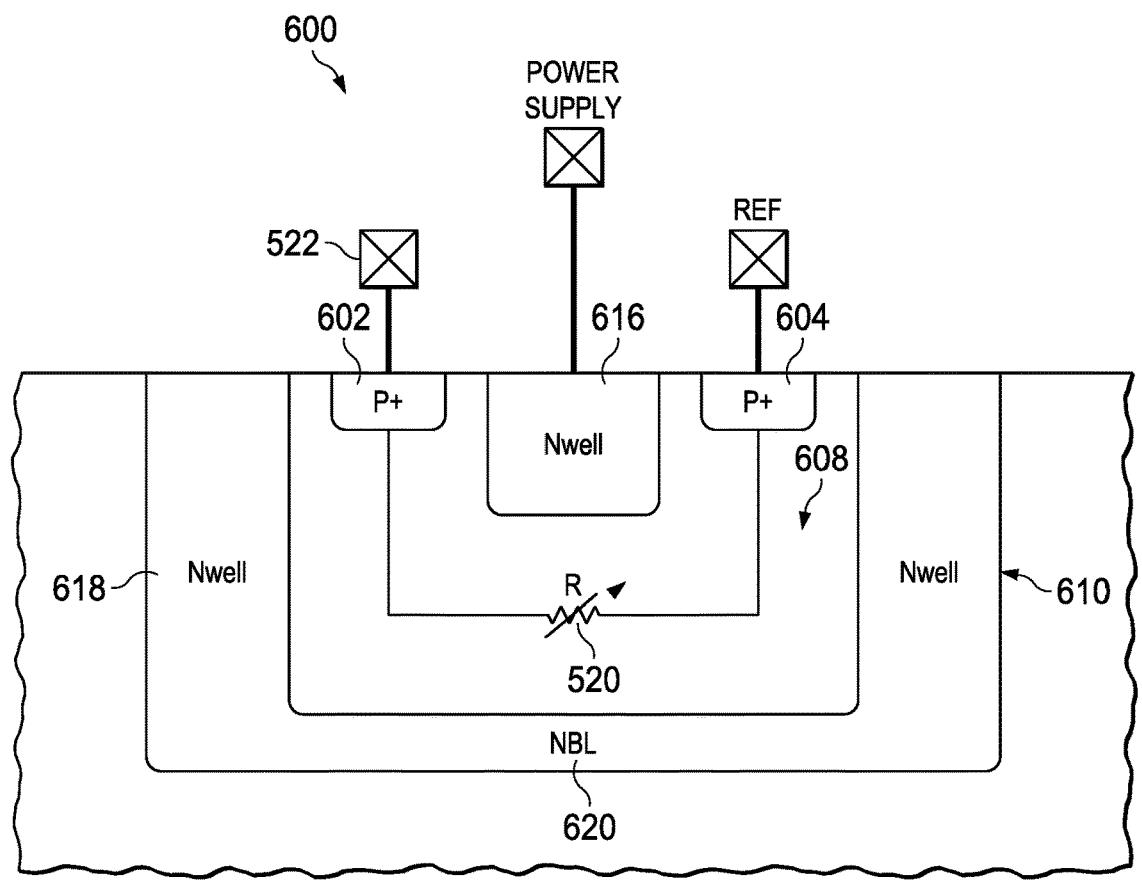
FIG. 6 is a cross-sectional view of an example of a semiconductor device implementing the ESD circuit of FIG. 5.

FIG. 6 is a cross sectional view of an example of a semiconductor device 600 that implements the circuit 500 of FIG. 5. The semiconductor device 600 includes a first P+ layer 602 and a second P+ layer 604 located in the interior 608 of an isolation tank 610. The contact 522 is coupled to the first P+ layer 602 and the reference node REF is coupled to the second P+ layer 604. An Nwell 616 is located in the interior of the isolation tank 610 and forms the cathodes of the diodes 504 and 506, FIG. 5. The anode of the first diode 504 is coupled to the first P+ layer 602 and the anode of the second diode 506 is coupled to the second P+ layer 604. An Nwell 618 and an NBL 620 form the isolation tank 610. The layer 602, layer 604, Nwell 616, Nwell 618, and the NBL 620 are sometimes referred to as doped semiconductor regions.

The resistor 520 is formed between the Nwell 616 and the NBL 620. The electrical path between the P+ layer 602 and the P+ layer 604 is referred to as a resistive path having a variable resistor. The resistance of the resistor 520 is a function of the voltage potential on the cathode of the diodes 504 and 506. One benefit of the semiconductor device 600 is that the resistor 520 is completely electrically isolated within the isolation tank 610.

Figure 7:
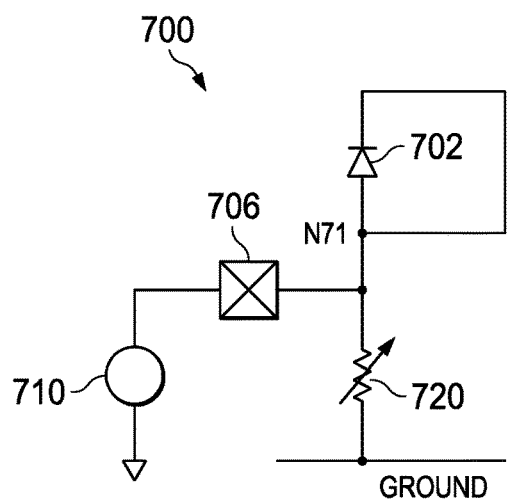
FIG. 7 is a schematic diagram of an ESD circuit.

FIG. 7 is a schematic diagram of another ESD circuit 700. The circuit 700 includes a diode 702 having an anode and a cathode that are coupled together at a node N71. The node N71 is coupled to a contact 706 that is coupled to a power supply 710. A variable resistor 720 is coupled between the node N71 and ground. The circuit 700 is implemented to protect the power supply 710 from ESD events. Referring to FIG. 3B, the circuit 700 may be implemented in the semiconductor device 300 by coupling the anode and cathode of the diode 230 together. Accordingly, the power supply 710 may be coupled to either node of the diode 230.

While some examples of ESD protection circuits have been described in detail herein, it is to be understood that the inventive concepts may be otherwise variously embodied and employed and that the appended claims are intended to be construed to include such variations except insofar as limited by the prior art.

What is claimed is:

1. A semiconductor device comprising:
   a substrate having a substrate surface;
   a first doped region disposed in the substrate below the substrate surface;
   a second doped region disposed in the substrate and extending between the substrate surface and the first doped region, and at least partially in contact with the first doped region, the first doped region and the second doped region together defining an isolation tank in the substrate, wherein the first doped region and the second doped region are n-type regions;
   a third doped region disposed in the isolation tank and being in contact with the substrate surface, the second doped region and the third doped region forming a diode; and
   at least one opening in the isolation tank, the opening forming a resistive path for current to flow between the substrate and the third doped region.

2. The semiconductor device of claim 1, further comprising a fourth doped region disposed in the substrate and outside the isolation tank, wherein a current path exists between the third doped region and the fourth doped region by way of the resistive path.

3. The semiconductor device of claim 1, wherein the third doped region is a p-type region.

4. The semiconductor device of claim 1, wherein the anode of the diode is coupled to the cathode of the diode.

5. The semiconductor device of claim 1, wherein the opening is in the first doped region.

6. The semiconductor device of claim 1, wherein the opening is in the second doped region.

7. The semiconductor device of claim 1, wherein the first doped region has a surface that is substantially parallel to the substrate surface.

8. The semiconductor device of claim 1, wherein the second doped region is substantially perpendicular to the substrate surface.

9. An electrostatic discharge (ESD) protection device for protecting a circuit from ESD, the device comprising:
- a first node of a first conductivity type coupled to the circuit;
- a second node of a second conductivity type for coupling to a first voltage potential;
- a third node of the first conductivity type for coupling to a second voltage potential, the second voltage potential being less than the first voltage potential;
- a diode coupled between the first node and the second node; and
- a resistor of the first conductivity type coupled between the first node and the third node, the value of the resistance of the resistor being a function of the voltage potential at the second node.

10. The device of claim 9, wherein the anode of the diode is coupled to the first node and the cathode of the diode is coupled to the second node.

11. The device of claim 9, wherein the second node is coupled to a voltage source terminal.

12. The device of claim 9, wherein the third node is coupled to a ground terminal.

13. The device of claim 9, wherein the resistance of the resistor increases in response to increases in the voltage on the second node.

14. The device of claim 9, wherein the resistor and the diode are a single unit.

15. A semiconductor device comprising:
- a substrate having a surface;
- an isolation tank located in the substrate below the surface, the isolation tank having an interior;
- a first doped region having a first conductivity type located in the interior;
- a second doped region having a second conductivity type located in the interior;
- a third doped region having the second conductivity type located in the interior;
- a resistance path extending between the second doped region and the third doped region and located between the first doped region and the isolation tank, the value of the resistance of the resistance path being a function of a voltage potential applied to the first doped region.

16. The semiconductor device of claim 15, wherein the second doped region is for coupling to a terminal of a circuit and providing ESD protection to the circuit.

17. The semiconductor device of claim 15, wherein the third doped region is for coupling to a reference voltage.

18. The semiconductor device of claim 15, wherein the first doped region is for coupling to a voltage source.

19. The semiconductor device of claim 15, wherein first doped region is an n-type region, the second doped region is a p-type region, the third doped region is a p-type region, and the interior is a p-type region.

* * * * *